(12) United States Patent
Finders et al.

(10) Patent No.: US 7,359,029 B2
(45) Date of Patent: Apr. 15, 2008

(54) LITHOGRAPHIC APPARATUS AND METHOD OF REDUCING THERMAL DISTORTION

(75) Inventors: Jozef Maria Finders, Veldhoven (NL); Erik Roelof Loopstra, Heeze (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 11/440,437

(22) Filed: May 25, 2006

(65) Prior Publication Data

US 2007/0273851 A1 Nov. 29, 2007

(51) Int. Cl.
*G03B 27/42* (2006.01)

(52) U.S. Cl. .............................. 355/30; 355/53; 355/67; 378/34

(58) Field of Classification Search .................. 355/30, 355/53, 67, 71
See application file for complete search history.

(56) References Cited

U.S. PATENT DOCUMENTS

| | | | |
|---|---|---|---|
| 6,440,619 B1 * | 8/2002 | Feldman | 430/30 |
| 6,445,439 B1 | 9/2002 | McCullough | 355/30 |
| 6,455,821 B1 | 9/2002 | Stumbo | 219/497 |
| 6,809,793 B1 | 10/2004 | Phan et al. | 355/30 |
| 2002/0148976 A1 * | 10/2002 | Chalupka et al. | 250/492.2 |

* cited by examiner

*Primary Examiner*—D. Rutledge
(74) *Attorney, Agent, or Firm*—Pillsbury Winthrop Shaw Pittman LLP (57) ABSTRACT

A lithographic apparatus is disclosed that has a heater configured to supply energy to a patterning device to heat the patterning device to form a desired thermal distortion pattern of the patterning device and a controller configured to effect an optical correction in the apparatus corresponding to the desired thermal distortion pattern to reduce the effect of thermal distortion of the patterning device on a pattern.

20 Claims, 5 Drawing Sheets

LITHOGRAPHIC APPARATUS AND METHOD OF REDUCING THERMAL DISTORTION

FIELD

The present invention relates to a lithographic apparatus and a device manufacturing method.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In optical lithography, for example, the illumination source is of a relatively high energy or high level of flux in order to achieve a required exposure dose and the patterning device will absorb a significant fraction of this energy. Additionally or alternatively, the patterning device may receive energy from other sources, such as motors, etc., particularly in non-optical lithography. As a result, the patterning device will increase overall in temperature and this increase may be uneven and pattern dependent. Overlay and/or focus induced problems may occur and thus performance of the lithographic apparatus may therefore be adversely affected. The heating of the patterning device may be complicated in a scanning lithography system, where, for example, the surface of the patterning device scans across a high energy illumination field.

SUMMARY

Accordingly, it would be advantageous, for example, to provide a system to thermally manage and compensate for a heated patterning device in a lithographic apparatus.

According to an aspect of the invention, there is provided a lithographic apparatus, comprising:

a support structure configured to hold a patterning device, the patterning device configured to impart the beam with a pattern;

a substrate table configured to hold a substrate;

a projection system adapted to project the patterned beam onto a target portion of the substrate;

a heater configured to supply energy to the patterning device to heat the patterning device; and a controller configured to effect an optical correction in the apparatus to reduce the effect of thermal distortion of the patterning device on the pattern.

According to a further aspect of the invention, there is provided a lithographic apparatus, comprising:

a support structure configured to hold a patterning device, the patterning device having a pattern;

a substrate table configured to hold a substrate;

a projection system adapted to transfer the pattern onto a target portion of the substrate;

a heater configured to supply energy to the patterning device to form a desired thermal distortion pattern of the patterning device; and a controller configured to effect a correction in the apparatus corresponding to the desired thermal distortion pattern.

According to a further aspect of the invention, there is provided a method of reducing an effect of a thermal distortion of a patterning device on an image of a pattern of the patterning device, the method comprising:

supplying energy to the patterning device to heat the patterning device to form a desired thermal distortion pattern of the patterning device; and applying an optical correction to the optical path of the image of the pattern toward a substrate, the optical correction corresponding to the desired thermal distortion pattern to reduce the effect of thermal distortion of the patterning device on the image of the pattern.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
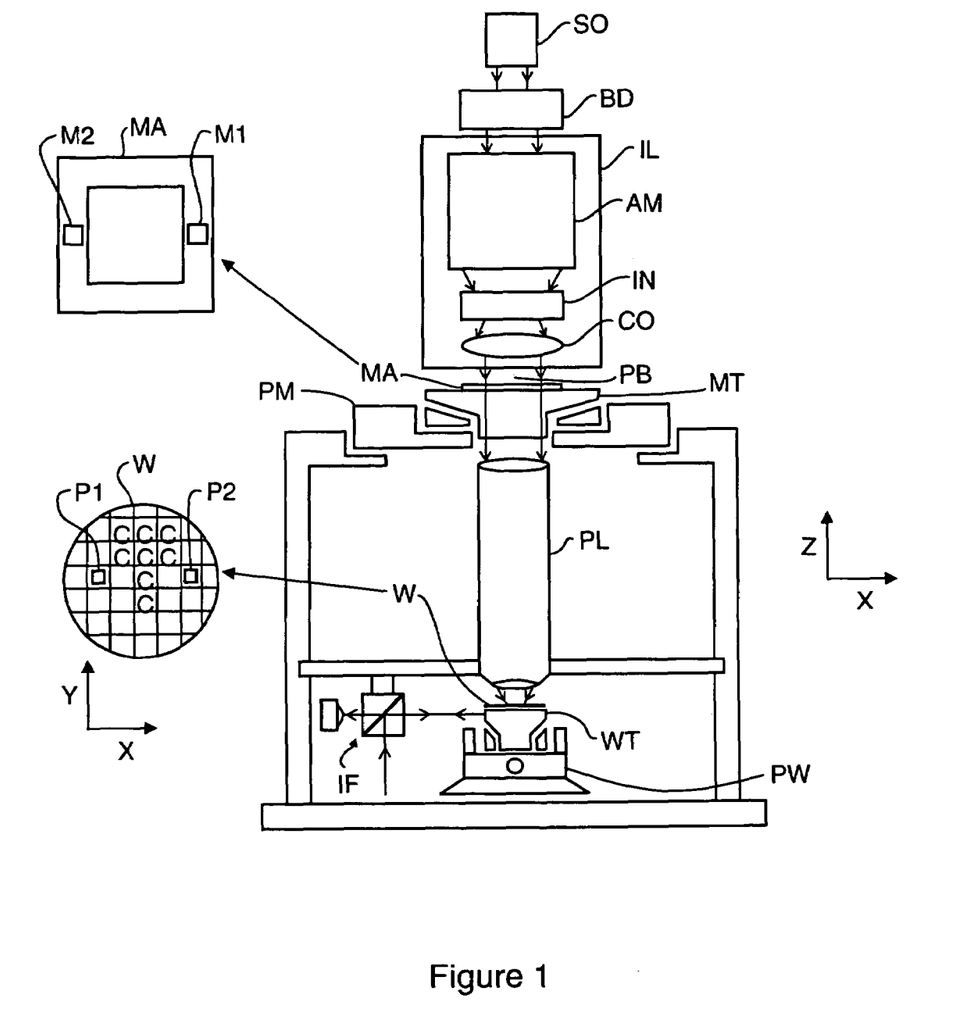
FIG. 1 schematically depicts a lithographic apparatus having a patterning device heater according to an embodiment of the invention.

FIG. 1 schematically depicts a lithographic apparatus according to an embodiment of the invention. The apparatus comprises:

an illumination system (illuminator) IL configured to condition a radiation beam B (e.g. UV radiation or DUV radiation);

a support structure (e.g. a mask table) MT constructed to hold a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more support structures). In such "multiple stage" machines the additional tables/support structure may be used in parallel, or preparatory steps may be carried out on one or more tables/support structure while one or more other tables/support structures are being used for exposure.

Referring to FIG. 1, the illuminator IL receives a radiation beam from a radiation source SO. The source and the lithographic apparatus may be separate entities, for example when the source is an examiner laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA thereby irradiating an area of the patterning device which is referred to hereinafter as the exposure field. The patterning device MA is held on the support structure (e.g., mask table) MT, and the radiation beam B is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

As discussed above, a patterning device may increase overall in temperature and this increase may be uneven and pattern dependent, resulting in a complex and perhaps unpredictable thermal distortion of the patterning device. Consequently, the thermal distortion distorts the pattern transferred to the substrate. Where, for example, the patterning device is a mask, the effect may be dependent on the mask transmission, which might vary over the mask and from mask to mask. Moreover, when the mask is moved (e.g., scanned) during exposure, a temperature variation, both spatially and in time, may occur. For example, since during scanning only a portion of the patterning device is illuminated at any one time, the patterning device may be distorted due to uneven heating or temperature gradients within the patterning device.

Figure 2:
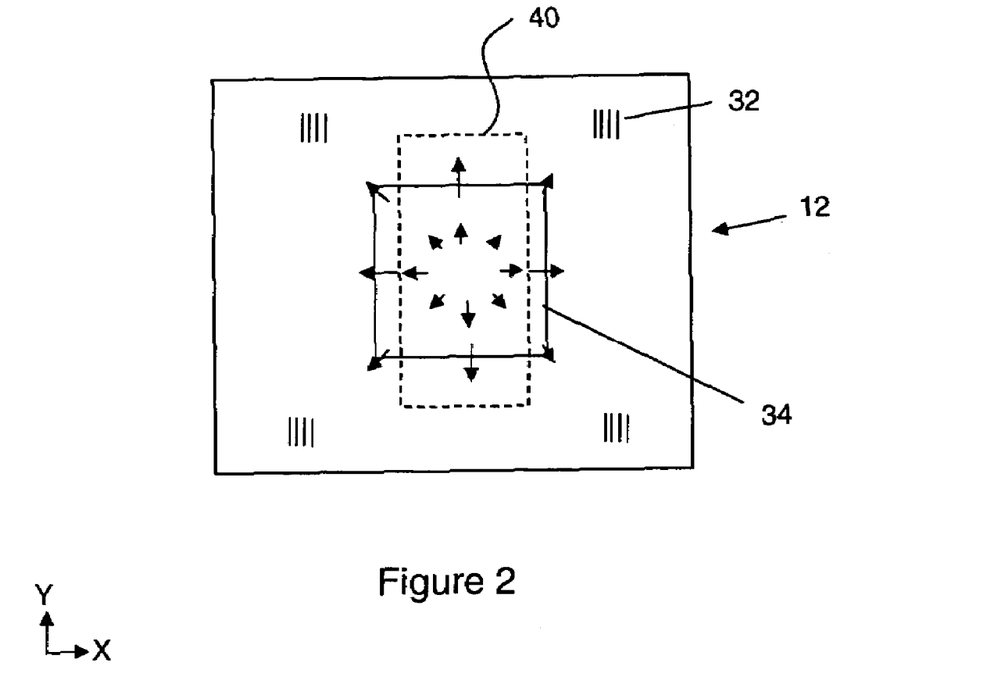
FIG. 2 schematically depicts a thermal distortion pattern of a patterning device according to an embodiment of the invention.

Referring to FIG. 2, during patterning device alignment and during the exposure sequence, the distortion due at least to the heating may be measured using measurement marks 32 on the patterning device 12. For example, in an embodiment, a plurality of marks, e.g., 4 or more marks, may be provided on the patterning device and an image of each mark may be measured by a transmission image sensor to determine deformation of the patterning device. To obtain data that reflects the deformation of the patterning device applicable to exposure, the marks should be placed as close as possible to the portion 34 of the patterning device having a pattern and more desirably, as close as possible to the exposure field 40 for that portion. Further, to measure the distortion as accurately as possible, as many marks as possible should be provided. While measurement of the distortion has been described with respect to using marks, other techniques, such as using one or more displacement or temperature sensors, may be used to arrive at the distortion through measurement, calculation, or a combination thereof. For example, a temperature distribution of the patterning device may be measured and the associated distortion of the patterning device may be calculated using physical properties of the patterning device. The distortion may be calculated using only physical properties of the patterning device or in combination with physical properties of the support structure MT (for example, to account for deformation contributions due to patterning device clamping forces). The spatial distribution of the distortion of the patterning device shall be referred to herein as the thermal distortion pattern. In an embodiment, the thermal distortion pattern comprises the actual values of the distortion of the patterning device as measured and/or calculated. In an embodiment, the thermal distortion pattern comprises the actual values of temperatures or other characteristics of the patterning device that act as a proxy of the distortion, which values may be measured and/or calculated.

With the determined thermal distortion pattern of the patterning device, various techniques may be used to correct for the thermal distortion of the patterning device. FIG. 2 shows a typical distortion pattern, depicted with arrows, of the patterning device during exposure. The distortion radiates out from the center of the patterning device where the cumulative exposure radiation is the most. The thermal distortion shape as depicted in FIG. 2, if sufficiently known, may be corrected for by applying a change to the magnification of the projection system in the X direction and applying a change to the magnification of the projection system in the Y direction. This correction may be only partially sufficient since a higher order term will remain, which remainder could yield an error during exposure in the range of several nanometers or less. Furthermore, such a correction will properly work if the shape is as depicted in FIG. 2. Where there are, for example, transmission variations across the patterning device, the shape may not be as regular and thus the correction may not work properly.

In an embodiment, to obtain a correctable thermal distortion pattern, the patterning device is heated to create a desired thermal distortion pattern that may be corrected for. So, for example, a desired spatial temperature distribution may be obtained in the patterning device that can be corrected for by one or more changes of the optical properties of the lithographic apparatus, such as a magnification change of the projection system of the lithographic apparatus.

Figure 3:
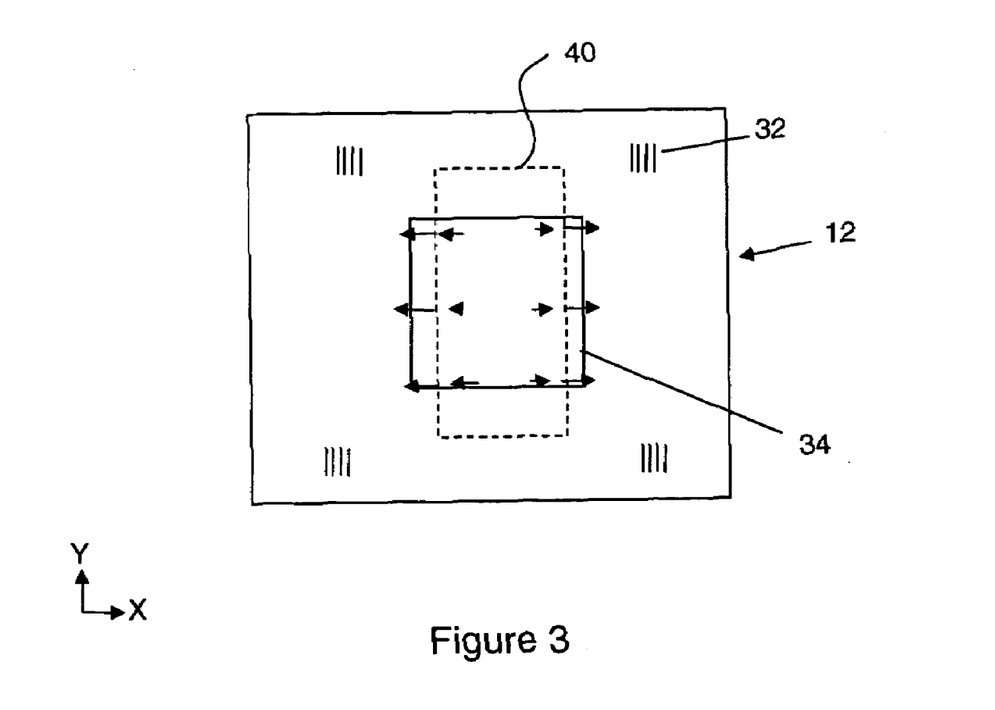
FIG. 3 schematically depicts a thermal distortion pattern of a patterning device created by supply of energy to heat the patterning device according to an embodiment of the invention.

The thermal distortion pattern of the patterning device may be changed, through supply of energy to heat the patterning device, from the distortion pattern, depicted with arrows, as shown in FIG. 2 to a distortion pattern, depicted with arrows, as shown in FIG. 3, the latter distortion pattern offering more correction possibilities than the former. For example, the distortion pattern of FIG. 3 may be fully corrected by a change in the magnification in the X direction of the projection system. For a non-uniform patterning device, for example, the energy to heat the patterning device may supplied in a way that varies in spatial distribution, intensity, time, or any combination of the foregoing, during exposure to obtain a more uniform heating across the patterning device and thus yield a thermal distortion pattern having good correction possibilities without the need of higher order adjustments. Similarly, for double patterning/double exposure, dependent on the split of the pattern between the double patterning/double exposure, the properties (e.g., transmission) of the two patterning devices may be quite different. In order to obtain a similar patterning device thermal distortion pattern for both patterning devices, the energy to heat the patterning devices may supplied in a way that varies in spatial distribution, intensity, time, or any combination of the foregoing, during exposure for each patterning device to obtain similar thermal distortion patterns.

Figure 4:
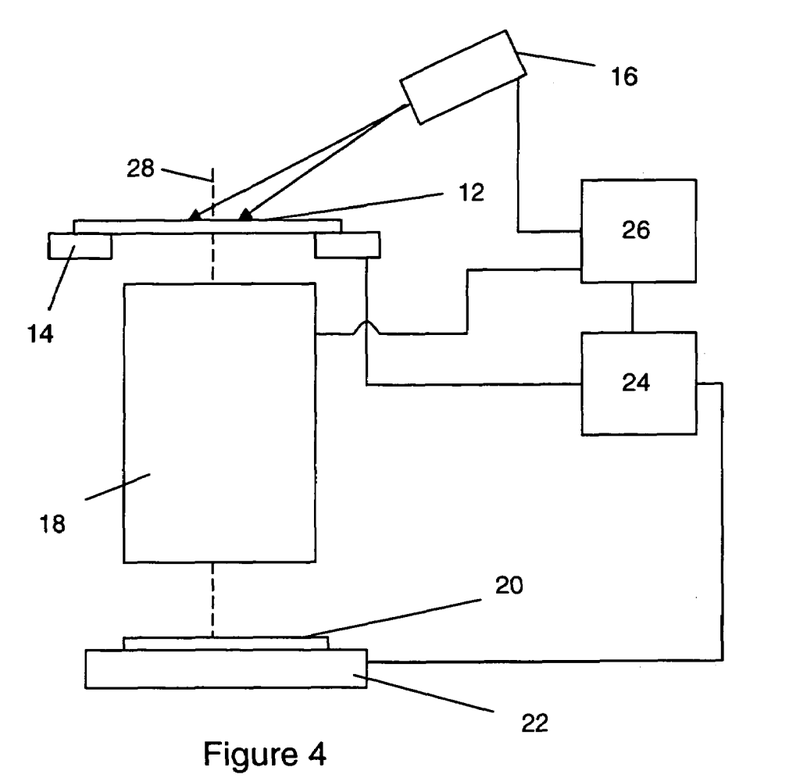
FIG. 4 schematically depicts a side view of a lithographic apparatus comprising a patterning device heater configured to supply energy to a patterning device according to an embodiment of the invention.

FIG. 4 schematically illustrates an embodiment of the present invention. A patterning device 12 is positioned on a support structure 14. An illumination source IL (not shown for clarity) provides radiation 28 to the patterning device 12 and transmitted from the patterning device 12 to the projection optics 18. In an embodiment, the patterning device 12 is a transmissive mask or a reflective mask. The projection optics 18 images the pattern associated with the patterning device 12, and imparted into the radiation 28, onto a substrate 20 held on a substrate table 22. The projection optics 18 will typically have a magnification less than one, forming a reduced image of the pattern of the patterning device 12. Often, the magnification is a reduction ration of 4:1, but other ratios can be used. Movement of the support structure 14 and the substrate table 22 is controlled by stage controller 24. In an embodiment, the support structure 14 and the substrate table 22 are synchronously scanned so that a scanning exposure is obtained and the entire image of the pattern associated with the patterning device 12 is reproduced onto the substrate 20. The relative speed of the support structure 14 and the substrate table 22 is proportional to the magnification of the projection optics 18.

A heater 16, placed adjacent and above the patterning device 12, is configured to supply energy to the patterning device 12 to create heat in or supply heat to the patterning device 12. The supplied energy helps to create a desired thermal distortion pattern of the patterning device 12. The heater 16 should have a quick response and, in an embodiment, be of low thermal mass. Therefore, rapid changes in temperature, and hence thermal distortion, of the patterning device may be achieved. The desired thermal distortion pattern may take any spatial shape that can be corrected for and in an embodiment, is a shape wherein substantially all the distortions in an exposure field of the patterning device extend in one direction, e.g., the X direction (see, e.g., the shape of FIG. 3).

A heater controller 26 is coupled to the heater 16, the stage controller 24, and, optionally, the projection optics 18 and/or illuminator IL. The heater controller is configured to control the supply of energy to the patterning device 12 by the heater 16. Based on the measured thermal distortion pattern, the heater controller 26 may cause the heater 16 to supply energy to the patterning device that may vary in terms of spatial distribution, intensity, time, or any combination of the foregoing. For example, signals from the heater controller 26 received by the heater 16 may be sequenced during a scanning operation, based on data, for example, received from the stage controller 24, so that even if the patterning device 12 has uneven absorption at different locations in the scan direction, the heater 16 may be adequately controlled temporally to compensate for each spatial location on the patterning device 12. Additionally or alternatively, the heater 16 may be controlled to spatially differentiate supply of energy along a direction transverse to the scan direction to compensate for any differences in the rate of absorption of the patterning device in a transverse direction to the scan direction (e.g., longitudinally along the exposure field). The heater 16 may therefore be controlled to compensate for different thermal absorptions on the patterning device 12.

In an embodiment, to create a desired thermal distortion pattern, an illumination device 16 is provided to supply radiation to the patterning device. In an embodiment, the illumination device 16 is located above the patterning device relative to the projection optics. The illumination device may be configured to supply a plurality of spatially separated radiation beams onto the patterning device (see, for example, the plurality of beams 42 in FIG. 5) and to that end, may comprise a series of radiation outlets, e.g. light emitting diodes. In an embodiment, the illumination device may be a laser or a lamp, for example, configured to provide multiple beams of radiation. In an embodiment, the radiation beams (e.g., outlets) should be independently addressable, for example, with respect to intensity of the radiation of the beam and the timing of the supply of the radiation beam, so as to be able to vary supply of the radiation to the patterning device in terms of spatial distribution, intensity, time, or any combination of the foregoing.

Figure 5:
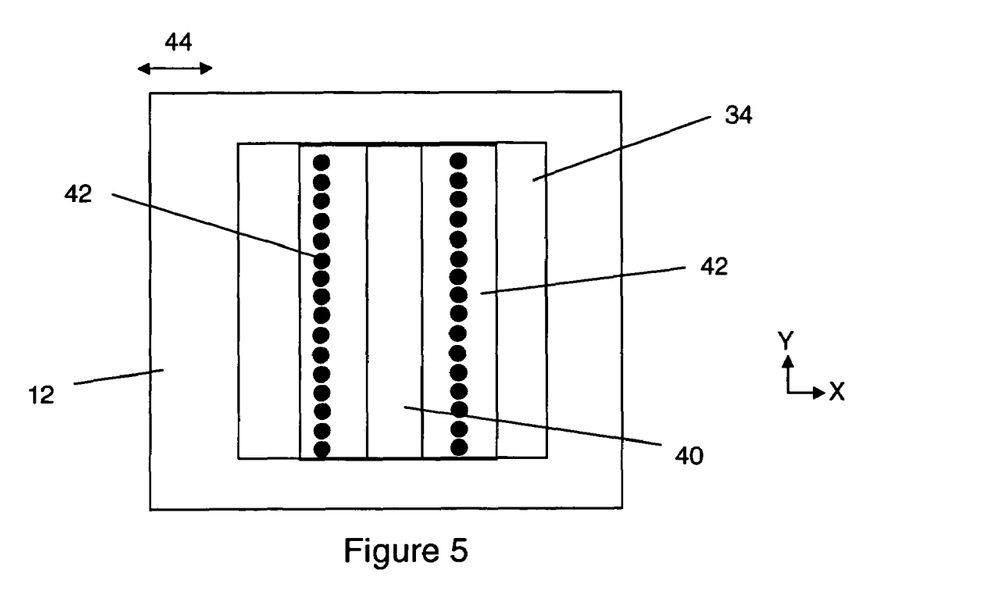
FIG. 5 schematically depicts a plan view of the supply of energy to the patterning device using the patterning device heater of FIG. 4.

Referring to FIG. 5, in an embodiment, the illumination device supplies radiation 42 to an area in front of and in back, in a direction of scanning shown by arrow 44, of the exposure field 40 on the patterning device 12. While in this embodiment the exposure field is rectangular, the exposure field may be in any other shape, such as arcuate, and the radiation is accordingly supplied in a manner that conforms to the shape of the exposure field. Further, in an embodiment, a plurality of beams are supplied to an area adjacent the exposure field and extending in a direction transverse to the scanning direction (see, for example, the plurality of beams 42 in FIG. 5).

In an embodiment, the radiation transmitted by the illumination device 16 is non-actinic light that won't significantly interfere with exposure of the patterning device. The wavelength of the radiation should be such it is absorbed by appropriate parts of the patterning device, e.g., if the patterning device is a mask then it should transmit through the quartz and be absorbed by the chrome.

Further, heater controller 26 is configured to make available a signal to the projection optics 18 and/or the illuminator IL to effect a correction corresponding to the desired thermal distortion pattern to reduce the effect of thermal distortion of the patterning device on the pattern of the patterning device. In an embodiment, the correction is an optical correction to the optical path of an image of the pattern toward a substrate. For example, the heater controller 26 may make available a signal to the projection optics 18 to effect a magnification change in a particular direction if the desired thermal distortion pattern has distortions substantially aligned in that direction. Other types of corrections, such as selective heating of the substrate, are possible and within the scope of an embodiment of the invention. In an embodiment, the correction may vary in terms of spatial arrangement, time of application, or any combination of the foregoing. For example, signals received by the projection optics 18 and/or illuminator IL may be sequenced during a scanning operation so that different amounts and types of correction may applied depending on the spatial location of the patterning device 12.

Figure 6:
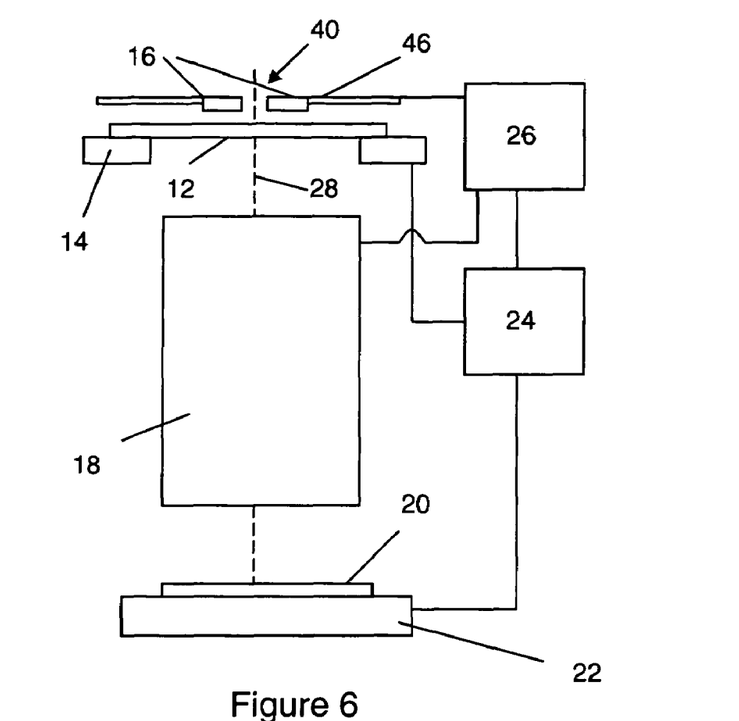
FIG. 6 schematically depicts a side view of a lithographic apparatus comprising a patterning device heater configured to supply energy to a patterning device according to an embodiment of the invention.
Figure 7:
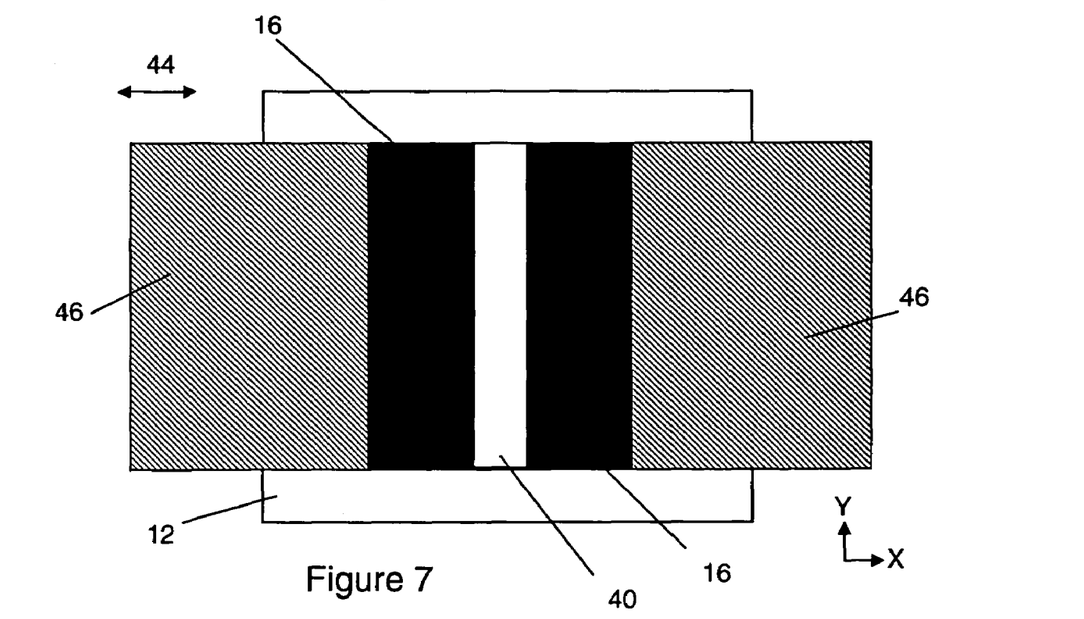
FIG. 7 schematically depicts a plan view of the patterning device heater of FIG. 6.

FIG. 6 schematically illustrates another embodiment of the heater 16. The heater 16 is a physical structure positioned immediately adjacent the exposure field 40 and above the patterning device 12. In an embodiment, the heater 16 is connected to a frame (not shown for clarity) of the apparatus via support 46 and the support structure 14 moves relative to that frame. The heater 16 provides heat to a portion of the patterning device 12 adjacent the exposure field 40 on the patterning device 12. FIG. 7 is a plan view of the heater 16 shown in FIG. 6. The heater 16 schematically illustrated may be any heating element, such as an electric heater, a radiation source (e.g., one or more light emitting diodes), a structure supplied with heated fluid, etc.

Figure 8:
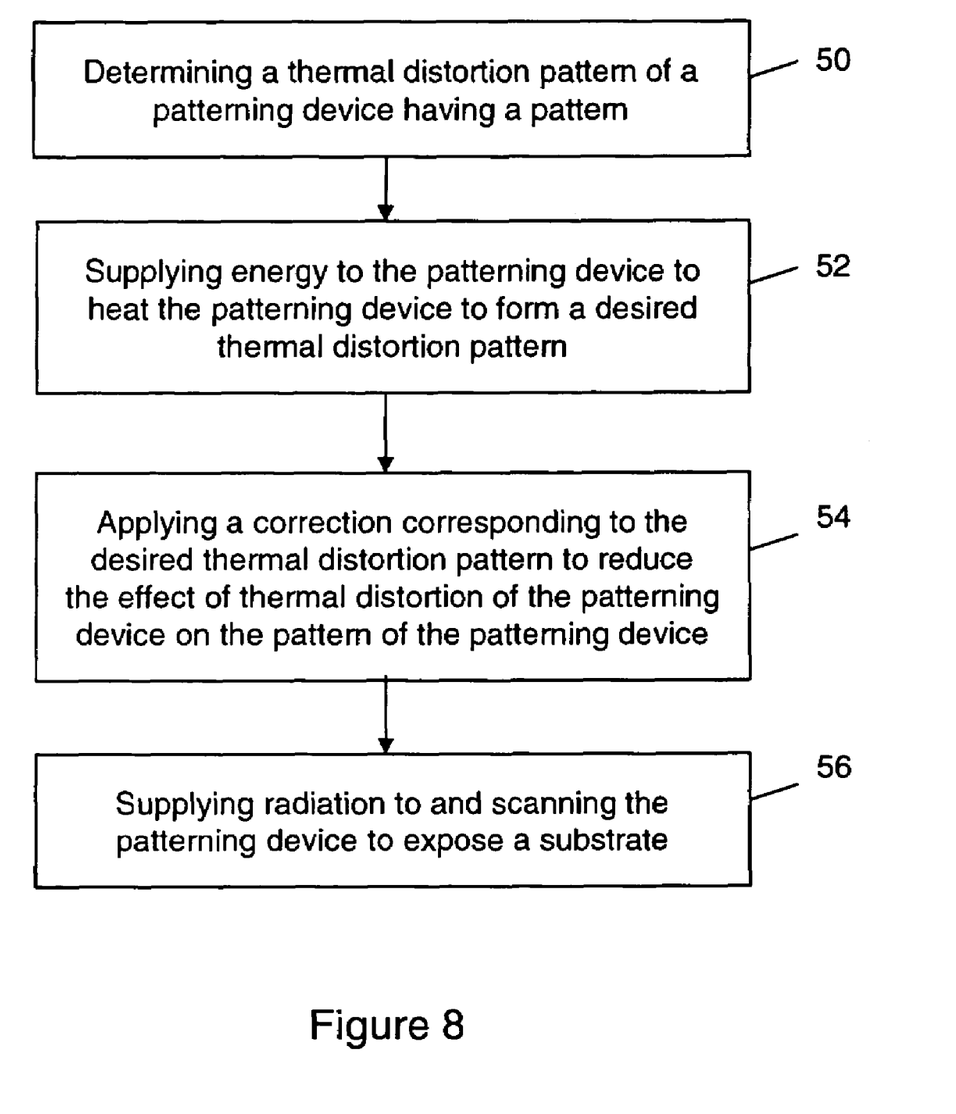
FIG. 8 is a block diagram illustrating a method of correcting for a thermal distortion pattern of patterning device according to an embodiment of the present invention.

FIG. 8 is a block diagram illustrating a method according to an embodiment of the invention. At block 52, a thermal distortion pattern of a patterning device having a pattern is determined. At block 54, energy is supplied to the patterning device to heat the patterning device to form a desired thermal distortion pattern. The specific amount, location and timing of energy supplied may be determined based on the determined thermal distortion pattern. At block 56, a correction is applied corresponding to the desired thermal distortion pattern to reduce the effect of thermal distortion of the patterning device on the pattern of the patterning device. In an embodiment, the correction is an optical correction to the optical path of an image of the pattern toward a substrate. At block 58, the patterning device is scanned and radiation supplied thereto to expose a substrate.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured. In this embodiment, the projection system would be a system configured to move the patterning device and/or substrate so that the patterning device contacts the substrate.

The lithographic apparatus may also be of a type wherein a surface of the substrate is immersed in a liquid having a relatively high refractive index, e.g. water, so as to fill a space between a final element of the projection system and the substrate. Immersion liquids may also be applied to other spaces in the lithographic apparatus, for example, between the patterning device and a first element of the projection system. Immersion techniques are well known in the art for increasing the numerical aperture of projection systems.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting, Thus, it will be apparent to those skilled in the art that modifications may be made to the invention as described without departing from the scope of the claims set out below.

What is claimed is:

1. A lithographic apparatus, comprising:
   a support structure configured to hold a patterning device, the patterning device configured to impart the beam with a pattern;
   a substrate table configured to hold a substrate;
   a projection system adapted to project the patterned beam onto a target portion of the substrate;
   a heater configured to supply energy to the patterning device to heat the patterning device; and
   a controller configured to effect an optical correction in the apparatus, other than supply of energy to the patterning device, to reduce the effect of thermal distortion of the patterning device on the pattern.

2. The apparatus of claim 1, wherein the optical correction comprises an adjustment to the magnification of the projection system.

3. The apparatus of claim 1, wherein the heater comprises an illumination device configured to supply radiation as the energy to the patterning device.

4. The apparatus of claim 3, wherein the illumination device is configured to direct a plurality of spatially separated beams of radiation onto the patterning device, each beam being individually controllable.

5. The apparatus of claim 4, wherein the illumination device comprises a plurality of light emitting diodes, each diode corresponding to one of the plurality of beams.

6. The apparatus of claim 1, wherein the heater is configured to supply the energy to an area immediately adjacent an exposure field on the patterning device.

7. The apparatus of claim 6, wherein the heater is configured to supply the energy to the front and back side of the exposure field in a direction of movement of the patterning device.

8. The apparatus of claim 6, wherein the heater is configured to supply varying energy in a direction transverse to a direction of movement of the patterning device.

9. The apparatus of claim 1, further comprising a measurement system configured to measure a physical characteristic of the patterning device to determine a thermal distortion pattern of the patterning device.

10. The apparatus of claim 1, wherein the heater is configured to supply energy to form a thermal distortion pattern of the patterning device, the thermal distortion pattern having a shape wherein substantially all the distortions in an exposure field of the patterning device extend in one direction.

11. A lithographic apparatus, comprising:
   a support structure configured to hold a patterning device, the patterning device having a pattern;
   a substrate table configured to hold a substrate;
   a projection system adapted to transfer the pattern onto a target portion of the substrate;
   a heater configured to supply energy to the patterning device to form a desired thermal distortion pattern of the patterning device; and
   a controller configured to effect a correction in the apparatus, other than supply of energy to the patterning device, corresponding to the desired thermal distortion pattern.

12. The apparatus of claim 11, wherein the correction comprises an adjustment to the magnification of the projection system.

13. The apparatus of claim 11, wherein the heater comprises an illumination device configured to direct a plurality of spatially separated beams of radiation onto the patterning device, each beam being individually controllable.

14. The apparatus of claim 11, wherein the thermal distortion pattern has a shape wherein substantially all the distortions in an exposure field of the patterning device extend in one direction.

15. A method of reducing an effect of a thermal distortion of a patterning device on an image of a pattern of the patterning device, the method comprising:
   supplying energy to the patterning device to heat the patterning device to form a desired thermal distortion pattern of the patterning device; and
   applying an optical correction to the optical path of the image of the pattern toward a substrate, the optical correction corresponding to the desired thermal distortion pattern to reduce the effect of thermal distortion of the patterning device on the image of the pattern.

16. The method of claim 15, wherein applying the optical correction comprises an adjustment to the magnification of a projection system used to project the image of the pattern.

17. The method of claim 15, wherein supplying the heat comprises directing a plurality of spatially separated beams of radiation onto the patterning device, each beam being individually controllable.

18. The method of claim 15, comprising supplying the energy to an area immediately adjacent an exposure field on the patterning device.

19. The method of claim 18, further comprising moving the patterning device and supplying the energy to the front and back side of the exposure field in a direction of movement of the patterning device.

20. The method of claim 15, further comprising measuring a physical characteristic of the patterning device to determine a thermal distortion pattern of the patterning device.

* * * * *